(12) United States Patent
Ghosh

(10) Patent No.: US 6,327,697 B1
(45) Date of Patent: Dec. 4, 2001

(54) METHOD FOR ROUTING CONDUCTIVE PATHS IN AN INTEGRATED CIRCUIT

(75) Inventor: Pradiptya Ghosh, Mountain View, CA (US)

(73) Assignee: Sun Microsystems, Inc., Palo Alto, CA (US)

(*) Notice: Subject to any disclaimer, the term of this patent is extended or adjusted under 35 U.S.C. 154(b) by 0 days.

(21) Appl. No.: 09/340,327

(22) Filed: Jun. 28, 1999

(51) Int. Cl.[7] .................................................. G06F 17/50
(52) U.S. Cl. .................................................. 716/13; 716/12
(58) Field of Search .................................. 716/11, 12, 13, 716/2, 14

(56) References Cited

U.S. PATENT DOCUMENTS

| | | | |
|---|---|---|---|
| 3,644,937 | * 2/1972 | Isett | 716/13 |
| 4,613,941 | * 9/1986 | Smith | 716/13 |
| 4,636,965 | * 1/1987 | Smith | 716/12 |
| 5,530,884 | 6/1996 | Sprague et al. | 712/210 |
| 5,603,001 | 2/1997 | Sukegawa et al. | 711/103 |
| 5,684,983 | 11/1997 | Ando | 712/225 |
| 5,685,009 | 11/1997 | Blomgren et al. | 712/23 |
| 5,696,955 | 12/1997 | Goddard et al. | 712/222 |
| 5,867,396 | 2/1999 | Parlour | 716/18 |
| 5,903,461 | * 5/1999 | Rostoker | 700/1 |
| 6,014,508 | * 1/2000 | Christian | 716/13 |
| 6,199,192 | * 3/2001 | Marquez | 716/12 |
| 6,240,542 | * 5/2001 | Kapur | 716/12 |
| 6,243,664 | * 6/2001 | Nazarian | 703/14 |
| 6,247,167 | * 6/2001 | Raspopovic | 716/13 |
| 6,260,183 | * 7/2001 | Raspopovic | 716/12 |

* cited by examiner

*Primary Examiner*—John F. Niebling
*Assistant Examiner*—Stacy A Whitmore
(74) *Attorney, Agent, or Firm*—Sierra Patent Group, Ltd.

(57) ABSTRACT

A method for routing conductive paths in an integrated circuit, each conductive path having a first pin and a second pin is described herein. The method includes separating at least two conductive paths into groups based on the connection type of each of said conductive paths, the connection type for a given conductive path being determined based on the types of pins at each end of the conductive path, ranking each group based upon how constrained each connection type is relative to each other connection type, choosing the group having the most constrained connection type which has not yet been routed, and routing each conductive path within the group chosen during the choosing operation.

20 Claims, 5 Drawing Sheets

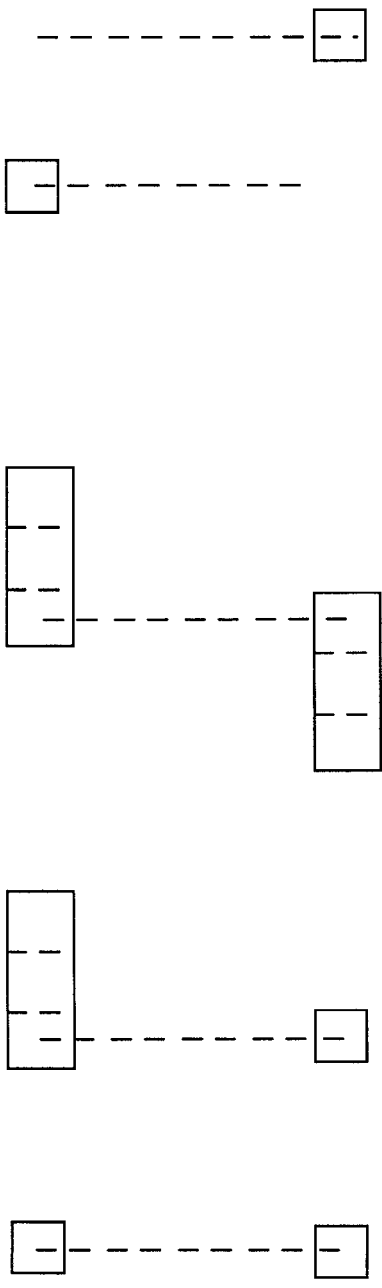
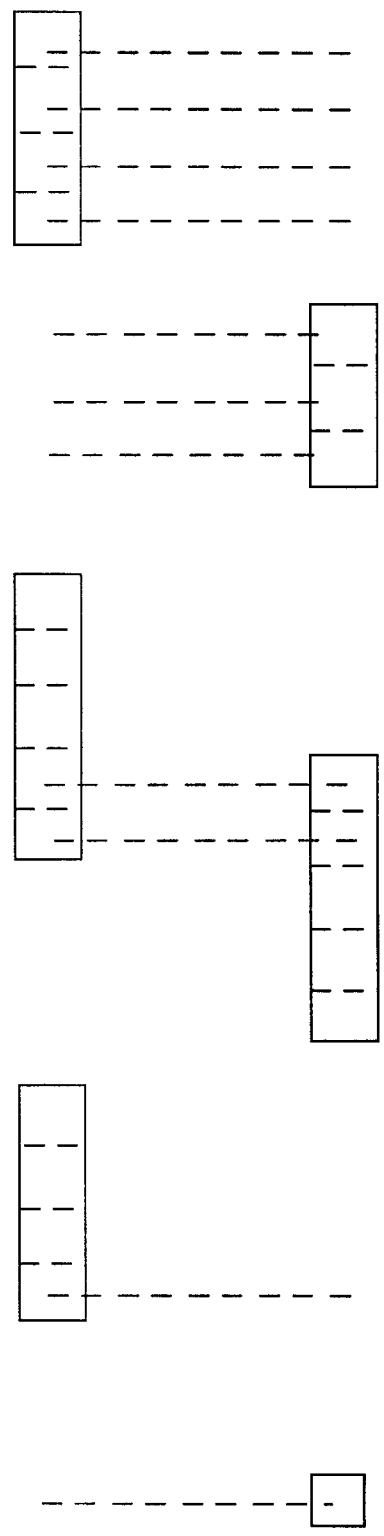

METHOD FOR ROUTING CONDUCTIVE PATHS IN AN INTEGRATED CIRCUIT

BACKGROUND OF THE INVENTION

1. Field of the Invention

The present invention provides a method for efficiently routing connections in an integrated circuit which minimizes the length of conductors and minimizes the total amount of metal required to be deposited in order to accomplish the routing.

2. The Background Art

Integrated circuits are complex devices having many different types of functional blocks within them. In situations where similar functions must be performed on many bits of data, circuits performing those functions are duplicated in functional blocks called datapaths. A second type of functional block commonly found in integrated circuits is called a control block. Control blocks typically perform functions relating to directing the flow of data, rather than operating on the data itself.

Integrated circuit designs include not only the individual circuits used in datapaths and control blocks, but also the connectivity between those circuits. The method used to route the conductive paths between various circuits is an important part of integrated circuit layout.

Prior art methods for routing conductive paths in a given area of an integrated circuit typically include three steps. First, the approximate length of each conductive path is determined. Next, all of the conductive paths in the given area are ordered from longest to shortest. Finally, the actual routing of each conductive path is determined, with the longest path being routed first, the next longest being routed second, and each other path being routed in succession from longest to shortest.

Though prior art methods work for their intended purposes, these methods tend to be inefficient in the use of possible vertical and horizontal routing areas, and tend to require more metal lines be deposited than are necessary to accomplish a given routing.

In this disclosure, a "pin" is defined as a contact point on an integrated circuit component where a metal line may be connected.

FIG. 1 is an example of conductive paths routed using prior art methods.

Referring to FIG. 1, functional block 10 includes circuitry having a pin 12 which must be connected to pin 14 of block 16. Correspondingly, pin 18 of block 20 must be connected to pin 22 of block 16. Finally, pin 24 of block 26 must be routed to pin 28 of block 30.

Design rules used when routing integrated circuits determine the possible locations for the placement of conductive paths. These locations are commonly called tracks. Horizontal and vertical tracks are typically placed on different metal layers of a multilayer layout.

FIG. 2 shows a typical layout of a prior art functional block.

Referring to FIG. 2, functional block 40 includes pins 42, 44, and 46, and tracks 48a through 48o inclusive.

Two general types of pins are used in integrated circuits: fixed pins and flex pins. Fixed pins are those pins having only a single track leading to them. Pin 46 is an example of a fixed pin. Flex pins are pins which lead to more than one track location. Since the pin is a conductive surface, any track location leading to a given pin may be used in routing.

However, prior art methods do not take into account the single or flex nature of a pin. If a pin have multiple choices for tracks to use when making a connection, prior art routers randomly choose one of the multiple available locations.

Referring again to FIG. 1, since longer conductive paths are typically routed first, the connection between pins 12 and 14 are routed, followed by pins 24 to 28, and pins 18 to 22. It can be seen that pins 12 and 14 have multiple possible track locations. However, in this example, the router has randomly chosen to use a track location which interferes with the ideal location for the conductive path required between fixed pins 18 and 22. Therefore, the router is forced to route the conductive path between pins 18 and 22 using a track location other than the ideal location, causing the path between pins 18 and 22 to be unnecessarily lengthened, and additional unnecessary metal to be deposited during manufacturing.

It would therefore be beneficial to provide a method for routing conductors which takes into account the types of pins at each end of a given conductive path.

It would also be beneficial to provide a method for routing conductors which minimizes the length of conductive paths and the amount of metal required for required conductive paths.

SUMMARY OF THE INVENTION

A method for routing conductive paths in an integrated circuit, each conductive path having a first pin and a second pin is described herein. The method includes separating at least two conductive paths into groups based on the connection type of each of said conductive paths, the connection type for a given conductive path being determined based on the types of pins at each end of the conductive path, ranking each group based upon how constrained each connection type is relative to each other connection type, choosing the group having the most constrained connection type which has not yet been routed, and routing each conductive path within the group chosen during the choosing operation.

BRIEF DESCRIPTION OF THE DRAWINGS

The present invention may be better understood, and its numerous objects, features, and advantages made apparent to those skilled in the art by referencing the accompanying drawings.

FIGS. 4A through 4G represent different connection types utilized in the practice of a method of the present invention.

DETAILED DESCRIPTION OF ONE EMBODIMENT

Those of ordinary skill in the art will realize that the following description of the present invention is illustrative only and not in any way limiting. Other embodiments of the invention will readily suggest themselves to such skilled persons having the benefit of this disclosure.

The use of the same reference symbols in different figures indicates similar or identical items.

The present invention significantly improves the prior art method of routing conductive paths in integrated circuits by categorizing the different paths by the type of pins at either end of the path, then routing the most restrictive paths first, followed by lesser restrictive path types in succession, until all paths are routed. By performing the routine in this manner, inefficient routings which commonly take place in the prior art are avoided.

Figure 3:
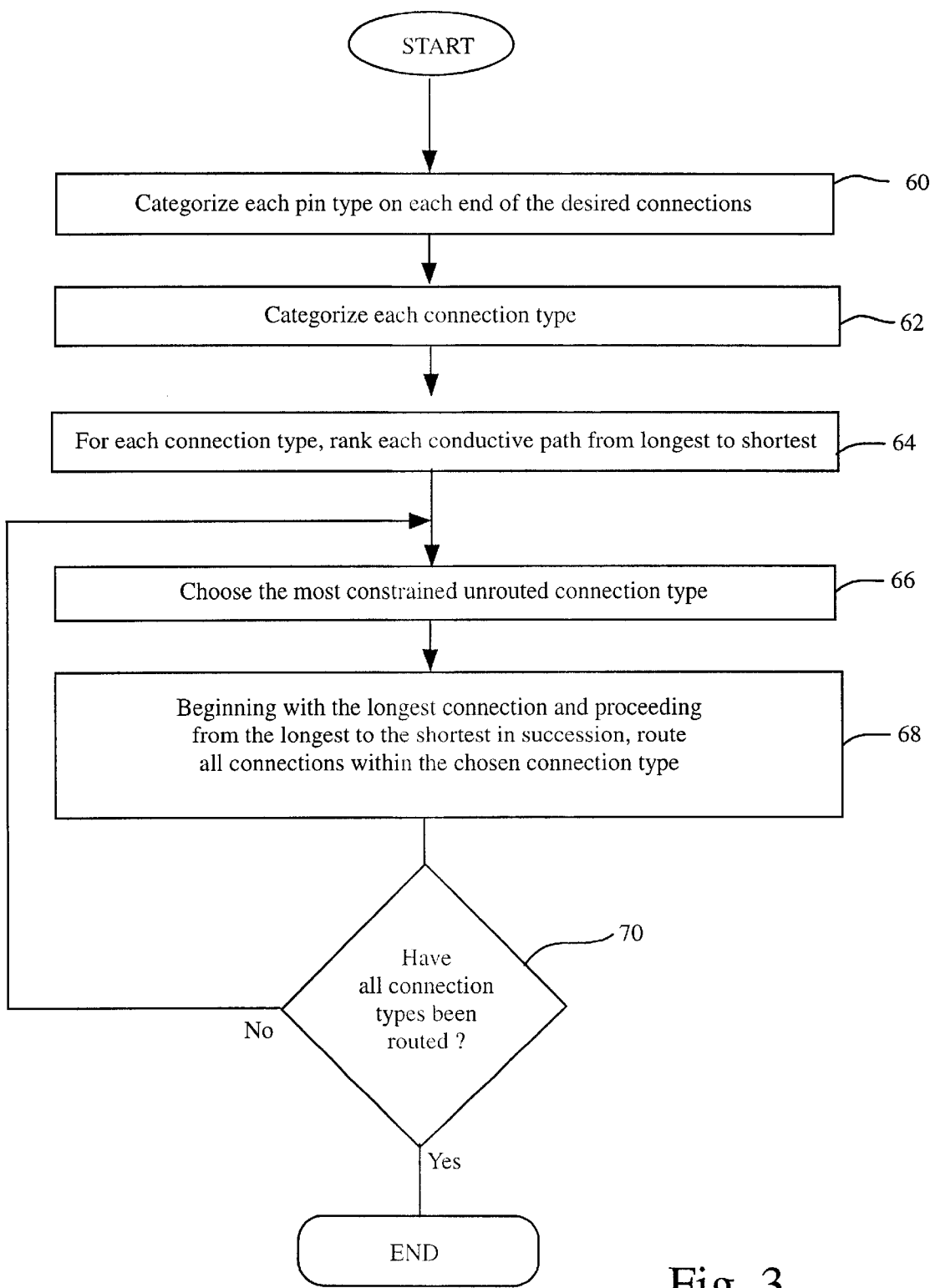
FIG. 3 is a flow chart showing a method according to the present invention.

FIG. 3 is a flow chart showing a method according to the present invention.

Referring to FIG. 3, a method of the present invention begins at block 60 where each desired conductive path is evaluated to determine what types of pins (fixed or flexible) are on each end.

Based on the results of the evaluation at block 60, the method proceeds at block 62 where each connection is categorized based upon various possible combinations. Those combinations are presented in FIGS. 4A through 4G. When two pins are described as sharing a common track, it is meant that the two pins are vertically aligned so that if a vertical metal line is deposited in the correct track, vias could be formed at both ends of the vertical metal line which would connect the line to both pins.

Referring briefly to FIG. 4A, a first category is defined where both ends of a conductive path have fixed pins and those pins share a common track.

A second category is defined in FIG. 4B where fixed pins are on both ends of a conductive path, and those fixed pins are horizontally do not have a common track which could be used to connect them.

A third category is defined in FIG. 4C where a fixed pin is on one end of a conductive path, a flex pin is on the other end and a common track is shared between the two pins.

A fourth category is defined in FIG. 4D where a fixed pin is on one end of the conductive path, and a flex pin is on the other end of the conductive path, with no common tracks which could be used to connect them.

A fifth category is defined in FIG. 4E where a flex pin is on each end of a conductive path, and there is only one common track between the two pins.

A sixth category is defined in FIG. 4F where a flex pin is on each end of a conductive path and there is more than one common track between them.

A seventh category is defined in FIG. 4G where flex pins are on each end of a conductive path, but the two pins share no common tracks.

Returning to FIG. 3, all conductive paths within a predefined area of the integrated circuit are categorized at block 62 using the categories just described in relation to FIGS. 4A through 4G, and other categories which are appropriate for the given Integrated Circuit design.

At block 64, the group of conductive paths within each connection type are ranked from longest to shortest.

At block 66, the most constrained unrouted connection type is chosen for routing. A first connection type is more constrained than a second connection type when the first connection type has fewer choices for tracks to use for the conductive path between its pins than the number of tracks available to use for the second connection type. For example, using the connection types of FIG. 4, the most constrained connection type is shown in FIG. 4A. The least constrained connection type is shown in FIG. 4G where there are multiple common tracks between the pins on either end of the conductive path.

At block 68, all conductive paths within the chosen connection type are routed beginning with the longest conductive path, proceeding with the next longest, and continuing by routing each path in succession from longest to shortest, until all conductive paths in the connection type have been routed.

At block 70, it is determined whether all connection types have been routed. If so the method ends. If not, the method proceeds with block 66 where another connection type is chosen to be routed.

Figure 1:
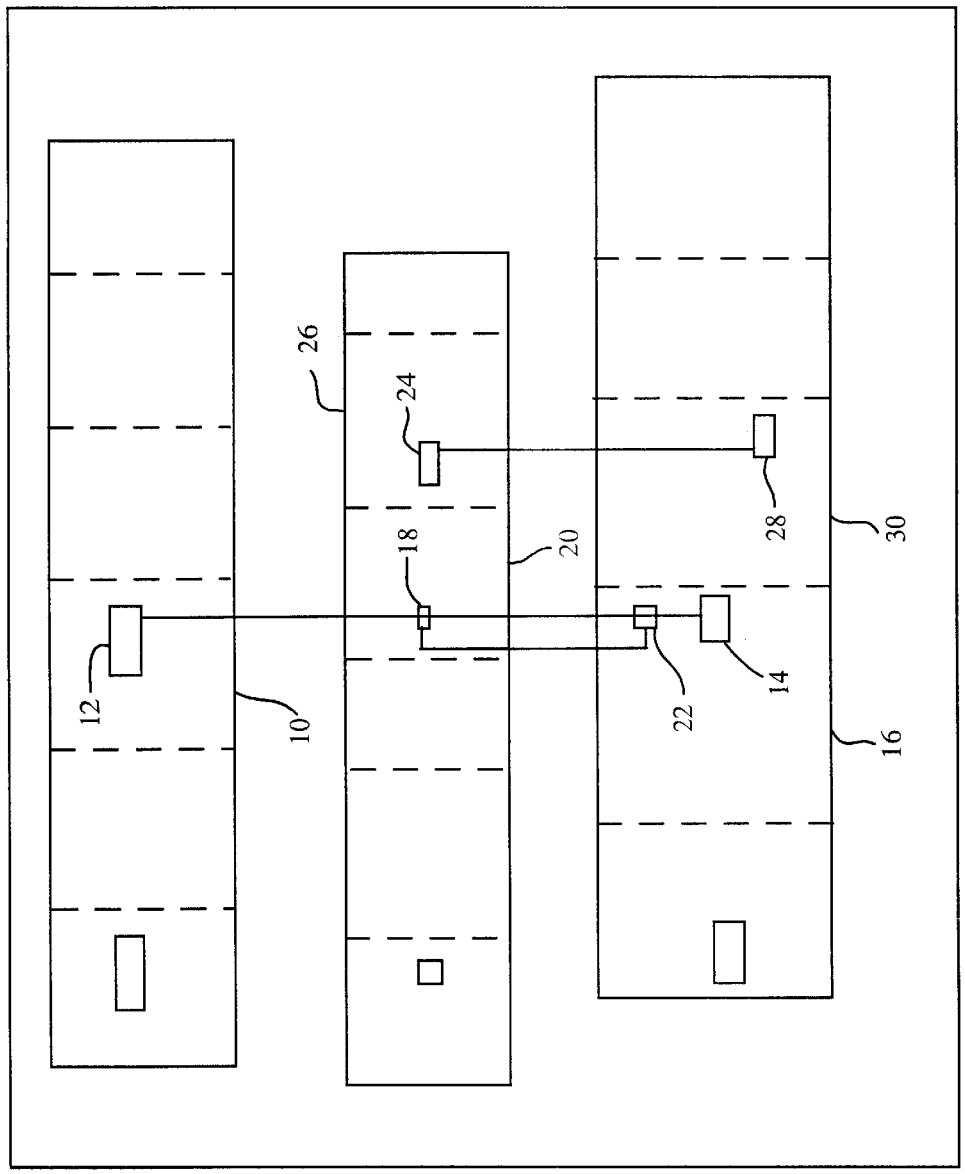
FIG. 1 is an example of conductive paths routed using prior art methods.
Figure 2:
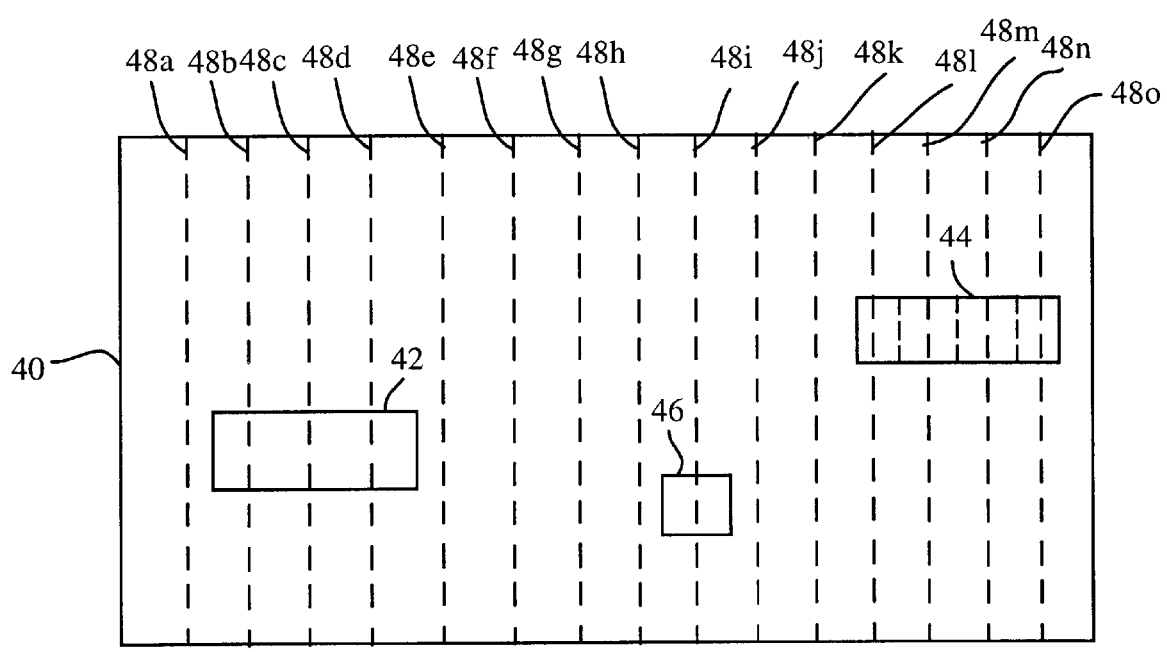
FIG. 2 shows a typical layout of a prior art functional block.
Figure 5:
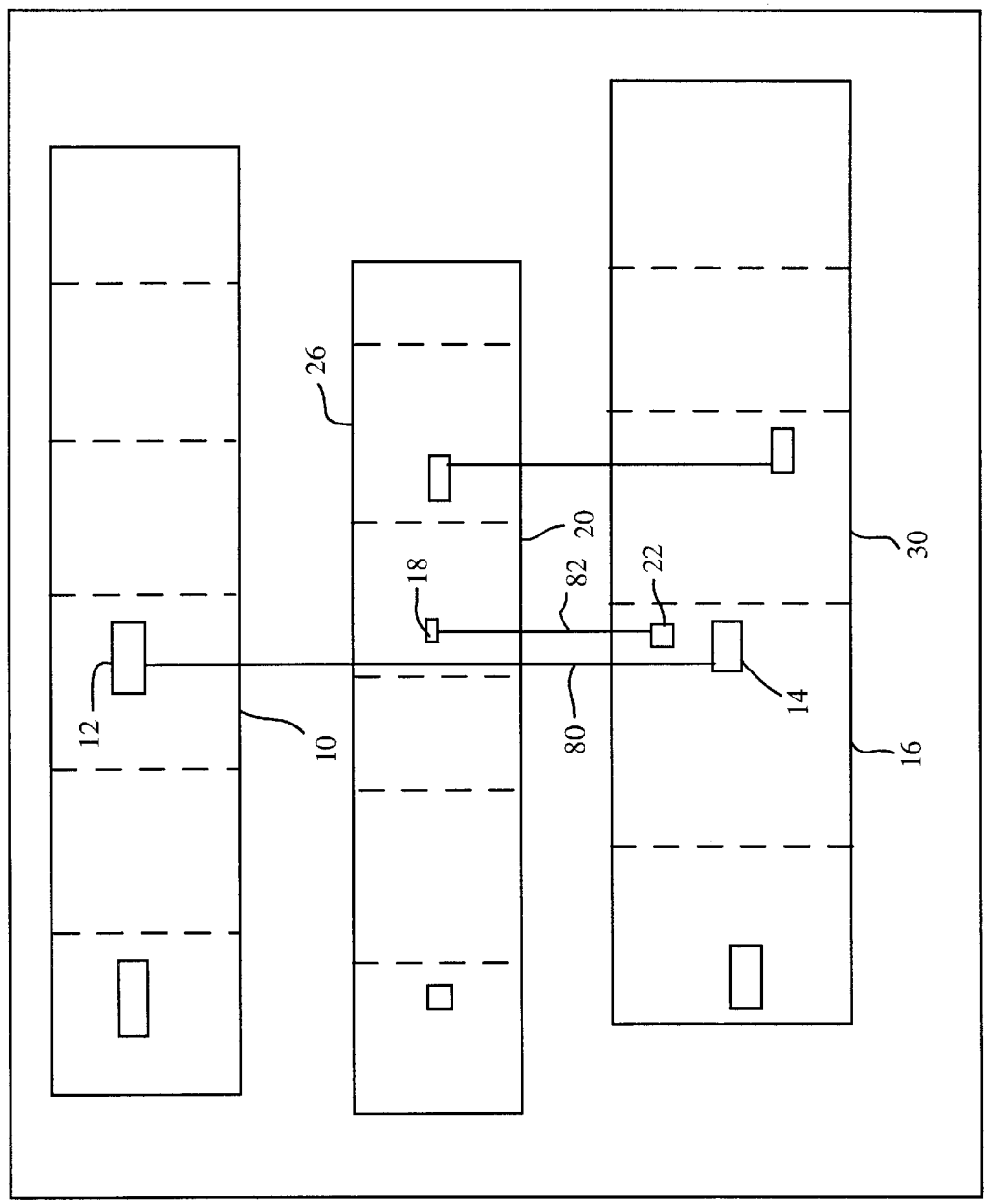
FIG. 5 shows a change to FIG. 1 which would result from practicing the present invention.

FIG. 5 shows a change to FIG. 1 which would result from practicing the present invention.

Referring to FIG. 5, conductive path 80 was routed differently than as seen in FIG. 1 since the more constrained connection type represented by pins 18 and 22 was routed first, resulting in conductive path 82. This result, when compounded thousands of times over an integrated circuit, minimizes the lengths of many hundreds of conductive paths, resulting in significantly less metal being deposited in a metal layer.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method for routing conductive paths in an integrated circuit, each conductive path having a first pin and a second pin, the method comprising:
    separating at least two conductive paths into groups based on the connection type of each of said conductive paths, said connection type for a given conductive path being determined based on the types of pins at each end of the conductive path;
    ranking each group based upon how constrained each connection type is relative to each other connection type;
    choosing the group having the most constrained connection type which has not yet been routed; and
    routing each conductive path within the group chosen at said choosing operation.

2. The method of claim 1 wherein said ranking step ranks a connection type having two fixed pins as more constrained than a connection type having at least one flex pin.

3. The method of claim 1 wherein said ranking step ranks a connection type having two fixed pins as more constrained than a connection type having two flex pins.

4. The method of claim 1 wherein said ranking step ranks a connection type having at least one fixed pin as more constrained than a connection type having two flex pins.

5. The method of claim 1 wherein said step of separating further comprises separating at least two conductive paths into groups based on the connection type of each of said conductive paths, said connection type for a given conductive path being determined based on the types of pins at each end of the conductive path and whether a track is commonly shared by said first and second pins.

6. The method of claim 5 wherein said ranking step ranks a connection type having pins sharing a common track as more constrained than a connection type having pins which don't share a common track.

7. The method of claim 5 wherein said ranking step ranks a connection type having two fixed pins sharing a common track as more constrained than a connection type having two fixed pins not sharing a common track.

8. The method of claim 5 wherein said ranking step ranks a connection type having a flex pin and a fixed pin sharing a common track as more constrained than a connection type having a flex pin and a fixed pin not sharing a common track.

9. The method of claim 5 wherein said ranking step ranks a connection type having two flex pins not sharing a common track as more constrained than a connection type having two flex pins sharing at least one common track.

10. The method of claim 5 wherein said ranking step ranks a connection type having two flex pins sharing less than two common tracks as more constrained than a connection type having two flex pins sharing at least two common tracks.

11. The method of claim 5 wherein said ranking step ranks a connection type having two flex pins sharing less than three common tracks as more constrained than a connection type having two flex pins sharing at least three common tracks.

12. The method of claim 5 wherein said ranking step ranks a connection type having two flex pins sharing less than four common tracks as more constrained than a connection type having two flex pins sharing at least four common tracks.

13. An apparatus for routing conductive paths in an integrated circuit, each conductive path having a first pin and a second pin, comprising:

means for separating at least two conductive paths into groups based on the connection type of each of said conductive paths, said connection type for a given conductive path being determined based on the types of pins at each end of the conductive path;

means for ranking each group based upon how constrained each connection type is relative to each other connection type;

means for choosing the group having the most constrained connection type which has not yet been routed; and means for routing each conductive path within the group chosen at said choosing operation.

14. The apparatus of claim 13 wherein said ranking means ranks a connection type having two fixed pins as more constrained than a connection type having at least one flex pin.

15. The apparatus of claim 13 wherein said ranking means ranks a connection type having two fixed pins a more constrained than a connection type having two flex pins.

16. The apparatus of claim 13 wherein said ranking means ranks a connection type having at least one fixed pin as more constrained than a connection type having two flex pins.

17. The apparatus of claim 13 wherein said means for separating further comprises means for separating at least two conductive paths into groups based on the connection type of each of said conductive paths, said connection type for a given conductive path being determined based on the types of pins at each end of the conductive path and whether a track is commonly shared by said first and second pins.

18. The apparatus of claim 17 wherein said ranking means ranks a connection type having pin sharing a common track as more constrained than a connection type having pins which don't share a common track.

19. The apparatus of claim 17 wherein said ranking means ranks a connection type having two fixed pins sharing a common track as more constrained than a connection type having two fixed pins not sharing a common track.

20. The apparatus of claim 17 wherein said ranking means ranks a connection type having a flex pin sharing a common track as more constrained than a connection type having a flex pin and a fixed pin not sharing a common track.

* * * * *